United States Patent [19]

Yariv et al.

[11] Patent Number: 4,562,569
[45] Date of Patent: Dec. 31, 1985

[54] TANDEM COUPLED CAVITY LASERS WITH SEPARATE CURRENT CONTROL AND HIGH PARASITIC RESISTANCE BETWEEN THEM FOR BISTABILITY AND NEGATIVE RESISTANCE CHARACTERISTICS AND USE THEREOF FOR OPTICAL DISC READOUT

[75] Inventors: Amnon Yariv, San Marino; Christoph Harder; Kam-Yin Lau, both of Pasadena, all of Calif.

[73] Assignee: California Institute of Technology, Pasadena, Calif.

[21] Appl. No.: 337,096

[22] Filed: Jan. 5, 1982

[51] Int. Cl.⁴ .......................... G11B 7/00; H01S 3/19
[52] U.S. Cl. .................................. 369/122; 369/120; 369/109; 372/46; 372/50
[58] Field of Search ....................... 369/120, 122, 109; 372/8, 50, 46

[56] References Cited

U.S. PATENT DOCUMENTS

| | | | |
|---|---|---|---|
| 3,427,563 | 2/1969 | Lasher | 372/50 |
| 3,504,302 | 3/1970 | Fenner | 372/50 X |
| 3,812,477 | 5/1974 | Wieder | 369/120 X |
| 3,941,945 | 3/1976 | Borner et al. | 369/122 X |
| 4,005,259 | 1/1977 | Kaneko | 369/109 |
| 4,055,815 | 10/1977 | Smith | 372/46 X |

OTHER PUBLICATIONS

"Buried Heterostructure AlGaAs Lasers on Semi-Insulating Substrates", Bar-Chaim et al., Electronics Letters, (Feb. 5, 1981), vol. 17, No. 3, pp. 108-109.
Repetitively Q-Switched Light Pulses from GaAs Injection Lasers with Tandem Double-Section Strip Geometry: Roldan et al.; IEEE Journal of Quantum Electronics, vol. QE-6, No. 6, Jun. 1970, pp. 339-352.
A Densely Packed Monolithic Linear Array of GaAs-$Al_xGa_{1-x}As$ Strip Buried Heterostructure Laser; Tsang et al., Appl. Phys. Lett. 34(2), Jan. 15, 1979.
Monolithic Integration of a GaAlAs Injection Laser with a Schottky-Gate FET., App. Physc. Lett., vol. 36, No. 3, Feb. 1, 1980.
Single-Wavelength Operation of 1.53 $\mu m$ GaInAsP-/InP Buried Heterostructure Integrated Twin Guide Laser . . . ; Kobayashi et al., Electronics Letters, (May, 28, 1981), vol. 17, No. 11, pp. 368-369.

*Primary Examiner*—Aristotelis M. Psitos
*Attorney, Agent, or Firm*—Freilich, Hornbaker, Rosen & Fernandez

[57] ABSTRACT

A two-segment contact buried heterostructure (BH) laser is pumped by a current applied to its absorber contact from a source of high impedance on the order of 100K$\Omega$ or more. The parasitic resistance between the absorber contact and the gain contact is high on the order of 10K$\Omega$. For a given absorber (bias) current the laser exhibits a relatively wide hysteresis on the order of 1 mA or more in the light vs. gain contact current. Such a laser is highly useful as a bistable optical element. The laser is also bistable with selected pump gain and absorber currents to exhibit a wide hysteresis of voltage across the absorber contact vs. relative amounts of light which is reflected back to the laser as feedback. The laser serve both as a light source and as a detector for reading out binary information stored as light reflective spots on a medium, e.g. a video disk.

27 Claims, 13 Drawing Figures

TANDEM COUPLED CAVITY LASERS WITH SEPARATE CURRENT CONTROL AND HIGH PARASITIC RESISTANCE BETWEEN THEM FOR BISTABILITY AND NEGATIVE RESISTANCE CHARACTERISTICS AND USE THEREOF FOR OPTICAL DISC READOUT

ORIGIN OF THE INVENTION

The Government has rights in this invention pursuant to Grant No. ECS-7909972 awarded by the National Science Foundation and Contract No. N00014-76-C-0322 awarded by the Office of Naval Research.

FIELD OF THE INVENTION

The present invention generally relates to semiconductor lasers and, more particularly, to a novel semiconductor laser which is useable as a bistable optical element.

DESCRIPTION OF THE PRIOR ART

Semiconductor lasers with inhomogenous excitation, such as the double contact structure have recently become objects of renewed interest as tightly compact and efficient bistable optical devices.

Such devices have important technological significance in the field of optoelectronic signal generation, detection and processing. Unfortunately, all known prior art inhomogenously pumped injection lasers showed very small if any hysteresis in the light vs. current through the gain section, hereinafter referred to as the gain current. In addition, these prior art lasers produced a pulsating light output.

One prior art laser showing a very small hysteresis and pulsating light output is described in an article (hereinafter also referred to as said article) entitled "Bistability and Pulsation in CW Semiconductor Lasers with a Controlled Amount of Saturable Absorption", authored by the applicants of the instant application. Appl. Phys. Lett. 39 (5) Sept. 1, 1981. Therein, a semiconductor buried heterostructure (BH) laser with a segmented contact arrangement is shown.

Basically, the laser comprises a plurality of layers of $Ga_{1-x}Al_xAs$ grown on a substrate of GaAs ($x=0$) to form a wave guide laser of $Ga_{1-x}Al_xAs$, where $x=0.08$, with n and p doped layers of $Ga_{1-x}Al_xAs$ (where $x=0.4$), cladding the waveguide layer above and below it, and with $Ga_{1-x}Al_xAs$ (where $x=0.3$) layers on both sides, with doping varying from $p^-$ to $n^-$, where the minus postscript represents low doping. Thereon is deposited the segmented contact of Cr-Au which is etched to form two separate contacts, referred to as the absorber and gain contacts, of width of 100 $\mu$m and 125 $\mu$m, respectively, spaced apart by 25 $\mu$m. The laser described and diagrammed in said article and summarized hereafter was made using a known process, which is described in an article in Electron Lett. 17,108 (1981).

As stated in said article the laser exhibited very narrow hysteresis curves in the light vs. gain current ($I_1$) characteristic for different values of absorber current ($I_2$). Also, the laser light was found to pulsate except for high $I_1$ (e.g., $I_1=42$ mA) and very small $I_2$, conditions under which no hysteresis was noticed. Such a laser could not serve as a useful bistable optical device.

Other prior art lasers, such as those described in Solid State Electron, 7,707 (1964); IEEE Journal Quant. Electron, QE-6,339 (1970); Electron Lett. 17,167 (1981), and Appl. Phys. Lett., 38,303 (1981), also exhibit little or no hysteresis. Also, they are beset by the associated pulsations in the optical output and therefore cannot serve as useful bistable optical devices.

A need therefore exists for a laser that is nonpulsating and exhibits a relatively large hysteresis for use as a reliable bistable optical element.

OBJECTS AND SUMMARY OF THE INVENTION

It is a primary object of the present invention to provide a semiconductor laser which is characterized by the absence of light pulsation and by stability in two states.

Another object of the present invention is to provide a semiconductor laser which is triggerable to assume either of two stable light output states with no pulsation.

A further object of the present invention is to provide a stable two-segment contact (gain and absorption) BH laser, characterized by a relatively large hysteresis in the light vs. gain current characteristic, and which can be used as a reliable bistable optical element.

A further object of the present invention is to provide a triggerable semiconductor laser with a stable relatively large hysteresis in the characteristic of an easily measurable parameter across the laser vs. relative light which is fed back to the laser.

Yet, a further object of the present invention is to provide a two-segment contact BH laser, with an intracavity detector, i.e. a laser wherein variations in the relative amounts of light fedback to the laser with respect to given relative amounts of light, result in significant easily measurable voltage changes across the absorber.

These and other objects of the present invention are achieved by a laser, such as the laser shown in said article, except for one major difference which accounts for unexpected results achieved with the laser of the present invention. The major difference between the laser described in said article and the one disclosed herein is in the parasitic resistance between the gain and the absorber contacts. Whereas in the laser described in said article the resistance between the two contacts was measured to be around 1 kilohms (1K$\Omega$) it has been found that a much higher parasitic resistance between the contacts, sufficient to produce very good electrical separation between them is needed for the laser to operate in a bistable condition and without any noticeable pulsation.

Alternately stated, it has been found that by significantly increasing the parasitic resistance between the contacts so that the absorber contact appears to be driven by nearly a pure current source the laser exhibits wide hysteresis in the light output vs. gain current ($I_1$) for different values of control of absorber current ($I_2$). Consequently, the laser is extremely useful as a bistable optical element. Also, it has been found that such a laser is characterized by a wide hysteresis in the characteristic of the voltage across the absorber contact, vs. the relative amount of feedback light, so that effectively the laser cavity acts not only as the light source but as a light detector as well. Such a laser has wide applications for readout of binary optically stored information.

BRIEF DESCRIPTIONS OF THE DRAWINGS

Figure 6:
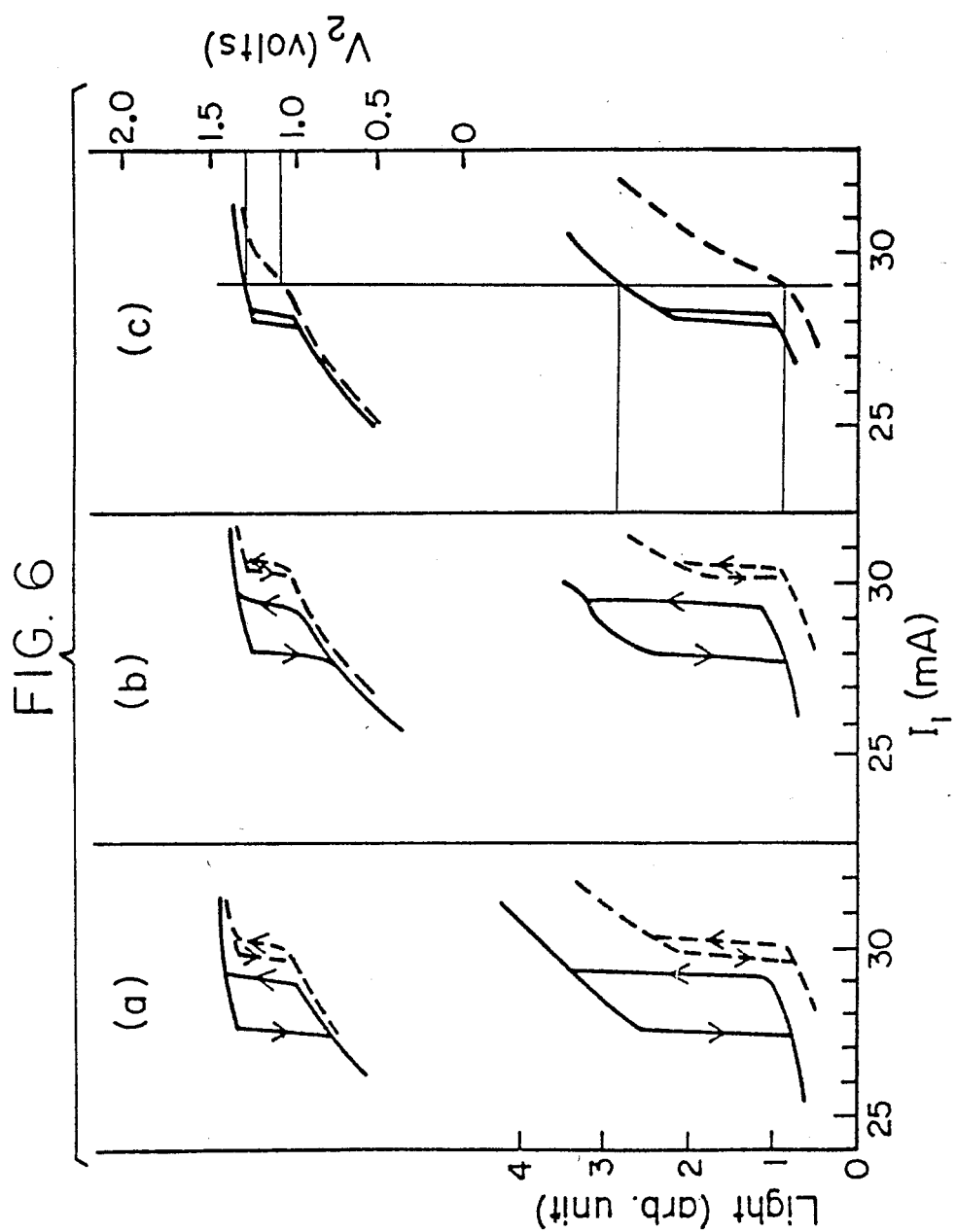
Figure 7:
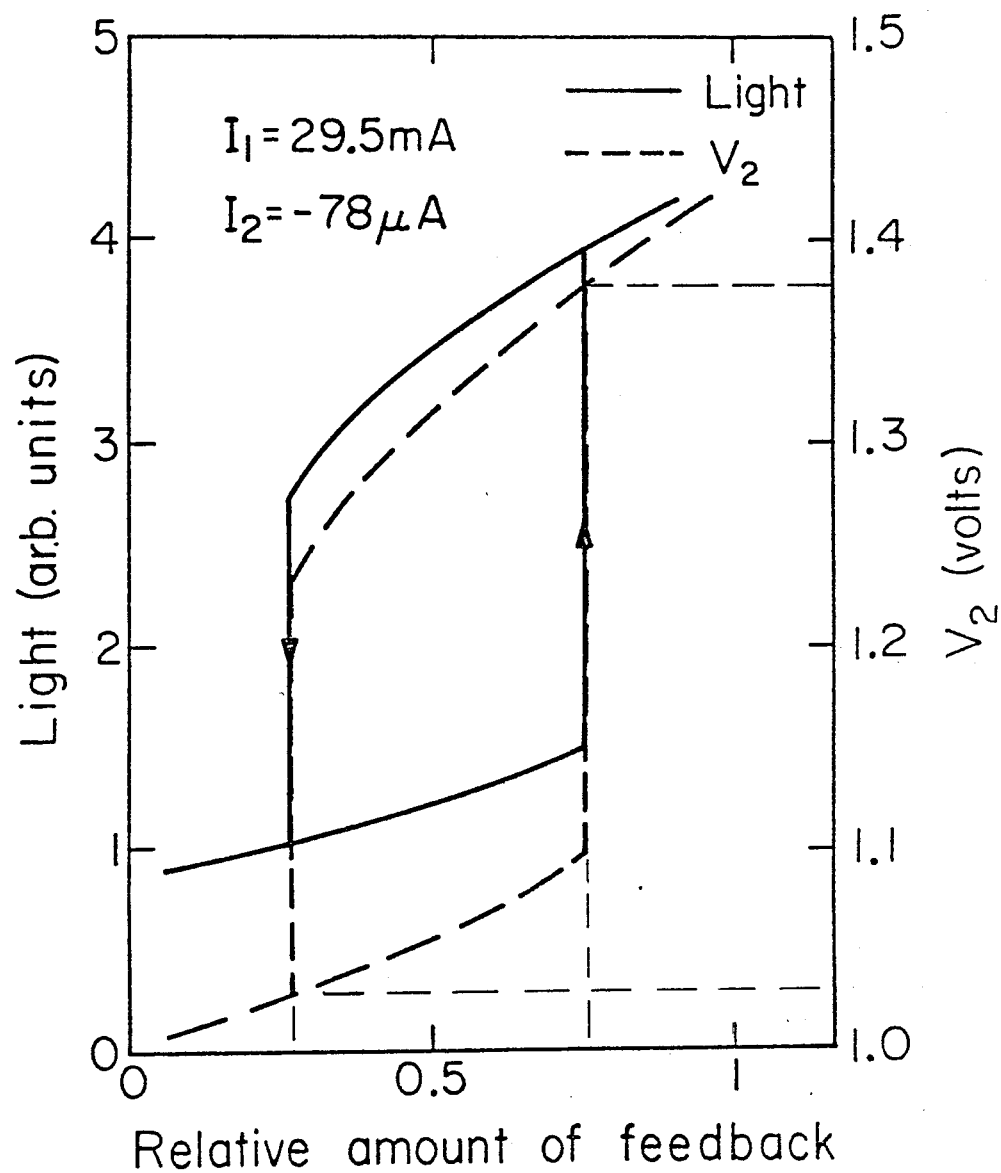
Figure 7A:
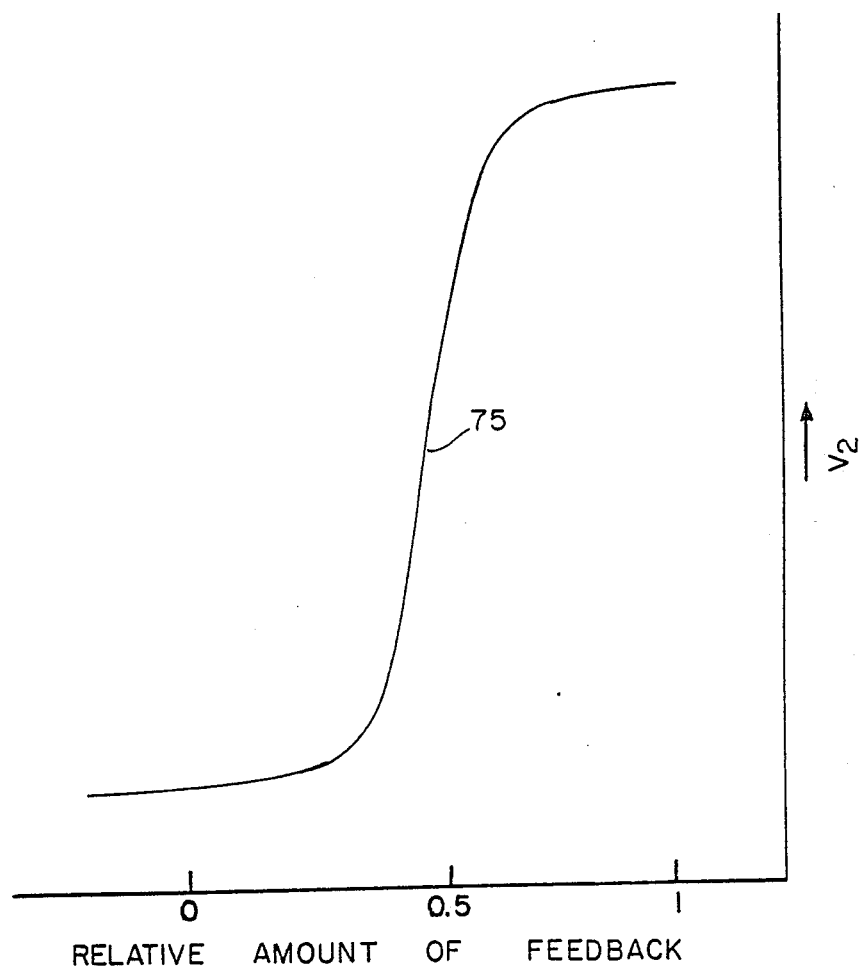

FIGS. 6a, 6b, and 6c are diagrams further useful in explaining the invention with optical feedback;

FIGS. 7 and 7a are diagrams of curves useful in explaining the invention with optical feedback.

Figure 8:
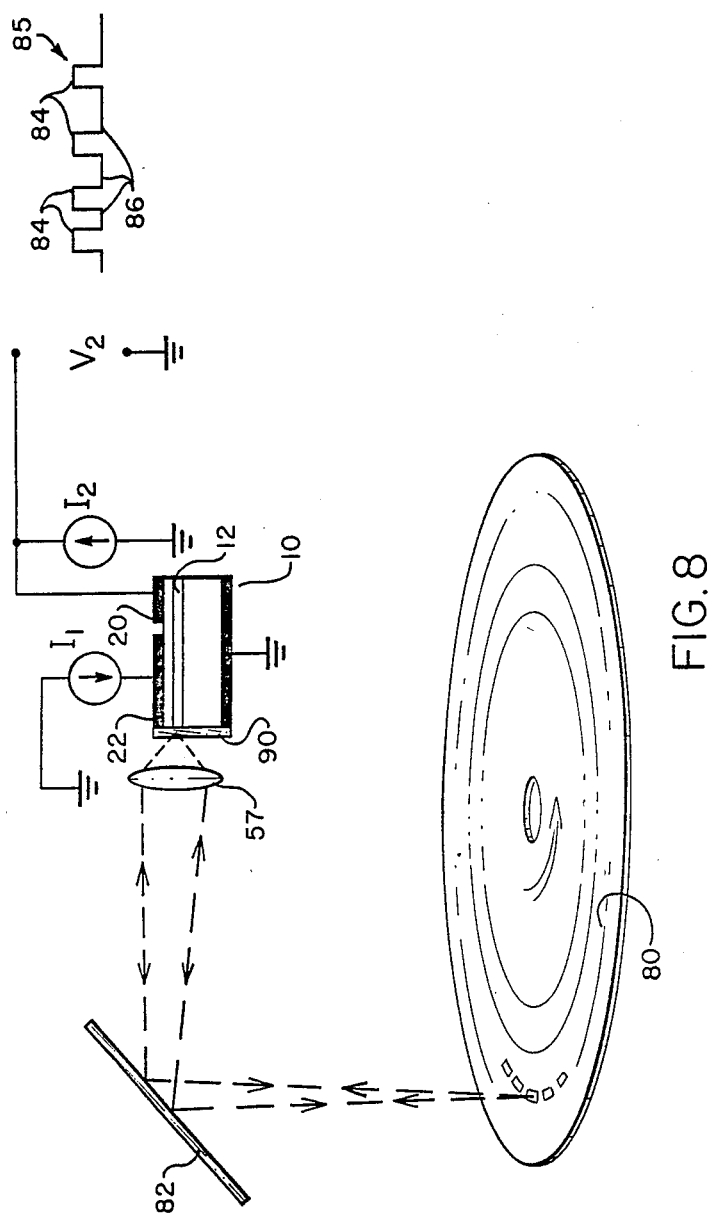

FIG. 8 is a diagram showing the invention in the context of reading out information from a video disk or the like.

DETAILED DESCRIPTION OF THE DRAWINGS

In the following description various specific values of various parameters, such as resistance, current, voltage, relative amounts of light which is fed back, as well as sizes of a laser layers and contacts and doping amounts will be given in order to explain the invention in connection with a specific laser, under various operating conditions, actually reduced to practice. It should however be appreciated that the invention is not intended to be limited to the specific examples hereinafter presented. Once the basic principles underlying the invention are understood by those familiar with the art, parameters and operating conditions other than those presented may be employed by them without departing from the scope of the invention.

Figure 1:
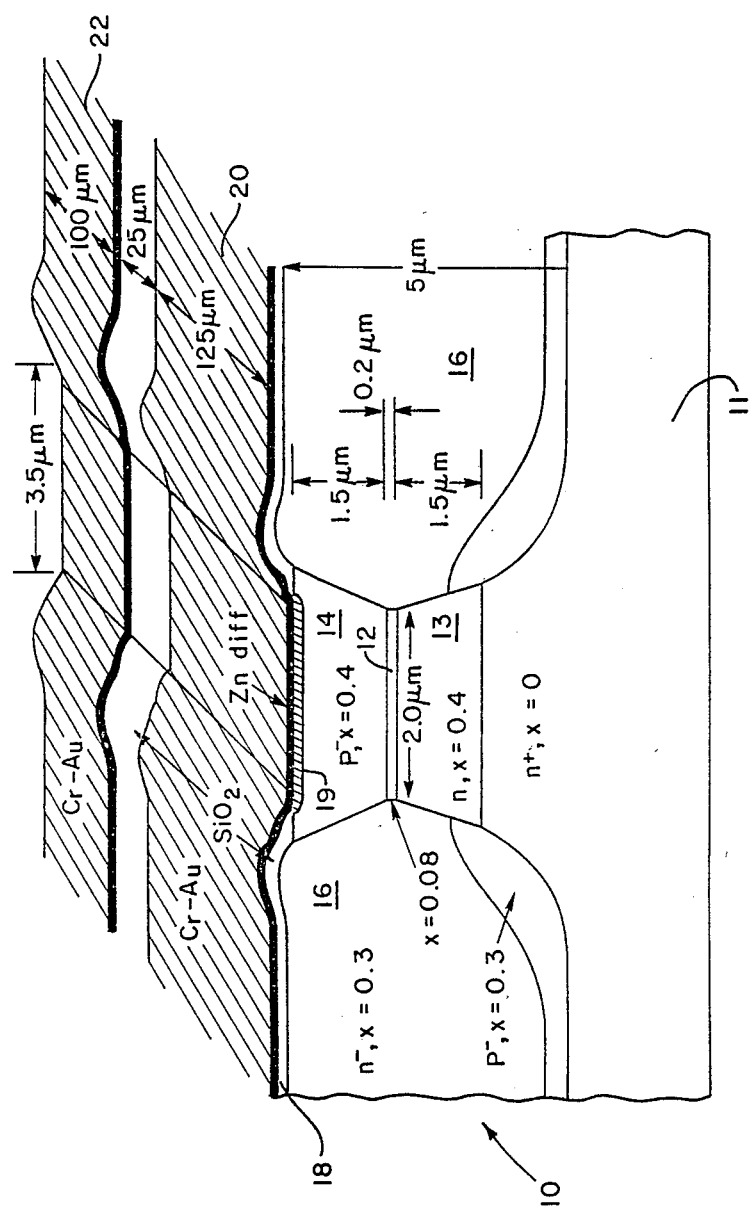
FIG. 1 is a single cross-sectional and isometric view of a two-segment contact BH laser, in accordance with the present invention.

Attention is now directed to FIG. 1 which is a cross-sectional and isometric view of a BH laser with a segmented contact. The laser 10 comprises a substrate 11 of $Ga_{1-x}Al_xAs$ where $x=0$ i.e. of GaAs, which is n doped. It also includes a waveguide layer 12, through which the light propagates transversely, which is buried between two cladding layers 13 and 14 of $Ga_{1-x}Al_xAs$ where $x=0.4$. Layer 13 is n doped while layer 14 is p doped with an appropriate material, e.g. germanium. The waveguide 12 is $Ga_{1-x}Al_xAs$ where $x=0.08$.

Layers 12–14 are within an etched section of a layer 16 of $Ga_{1-x}Al_xAs$ where $x=0.3$ and which varies in doping from low p doping near the substrate 11 to low n doping near the top. A layer 18 of $SiO_2$ is deposited on layers 16 and 14 except that a layer 19 of Zn is diffused over most of layer 14. A contact layer of Cr-Au is deposited on top and a wide stripe is etched in it to form two separate spaced-apart contacts, a control or absorber contact 20 and a gain contact 22. Layer 16 is shown to be 5 μm thick, and the widths of contacts 20 and 22 are 125 μm and 100 μm, respectively, with the etched gap between them being 25 μm.

In term of general construction, laser 10 is similar to that shown in said article with one major difference. In said article, the layer corresponding to the upper cladding layer 14 is designated as p doped by the letter p. In the present invention, laser 10, layer 14 is designated as p doped by $p^-$, wherein the minus (−) postscript represents a lower level of doping, than that of the corresponding layer in the laser described in said article. The reason for the reduced doping and the advantage realized therefrom will become apparent from the following description.

Figure 2:
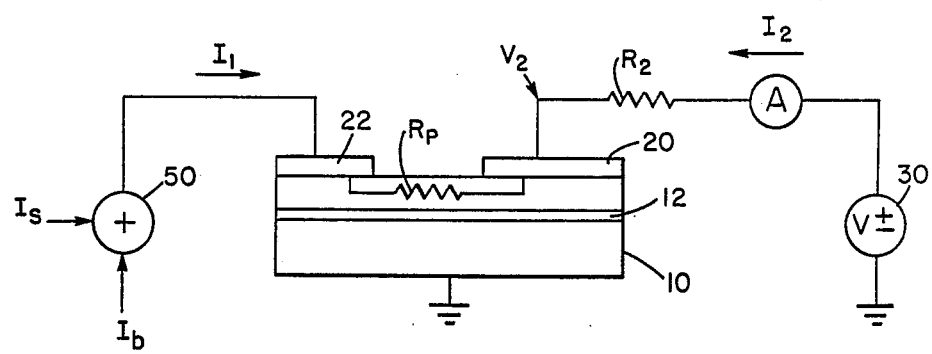
FIG. 2 is a simplified side view of the laser, useful in explaining one aspect of the invention.

Attention is now directed to FIG. 2 wherein laser 10, the waveguide 12 and the absorber contact 20 and the gain contact 22 are shown schematically in side view. As is known, currents are supplied to both contacts with the laser substrate at ground potential. The gain current is designated $I_1$ and the absorber current $I_2$. The latter is pumped with current, designated by the circled letter A and arrow $I_2$ from an electrical source 30. The output impedance of source 30 is represented by resistance $R_2$ and the voltage across the absorber contact is designated by $V_2$.

As is appreciated, an electrical source such as a voltage source, when characterized by a high output impedance and driving a high resistance load acts as a current source. In FIG. 2, source 30 is also designated by the voltage $V^\pm$. Hereafter, $V_2$, $R_2$ and $I_2$ will be discussed primarily.

As shown in FIG. 1, the contacts 20 and 22 are separated by the gap between them. However, the resistance between them is not infinite. In FIG. 2, and hereafter, the resistance between the contacts is often referred to as the parasitic resistance and is designated in FIG. 2 by $R_p$. As is appreciated by those familiar with the art, $R_p$ is effectively in parallel with $R_2$.

It has been discovered that a very good electrical isolation between the two contacts is practically essential in order for the laser to be able to operate in a bistable mode and without pulsation. In order to achieve such electrical isolation, $R_p$ has to be considerably larger than 1KΩ, as measured for the laser described in said article. Since the source impedance $R_2$ is effectively in parallel with $R_p$ it is highly desirable to choose $R_2$ to be quite large, preferably on the order of one or more hundreds of kilohms, e.g. 200–400KΩ. Such a large resistance hardly affects the electrical isolation provided by $R_p$.

In one embodiment which was actually reduced to practice, $R_p$ was increased significantly from 1KΩ to about 10KΩ by lowering the p doping of layer 14 as previously stated and as represented in FIG. 1 by $p^-$. In the particular embodiment the p doping was on the order of $2 \times 10^{16}$ (atoms of germanium per cubic cm of layer 14) which was less than the p doping of the corresponding layer in the laser of said article by an order of magnitude.

Figure 3:
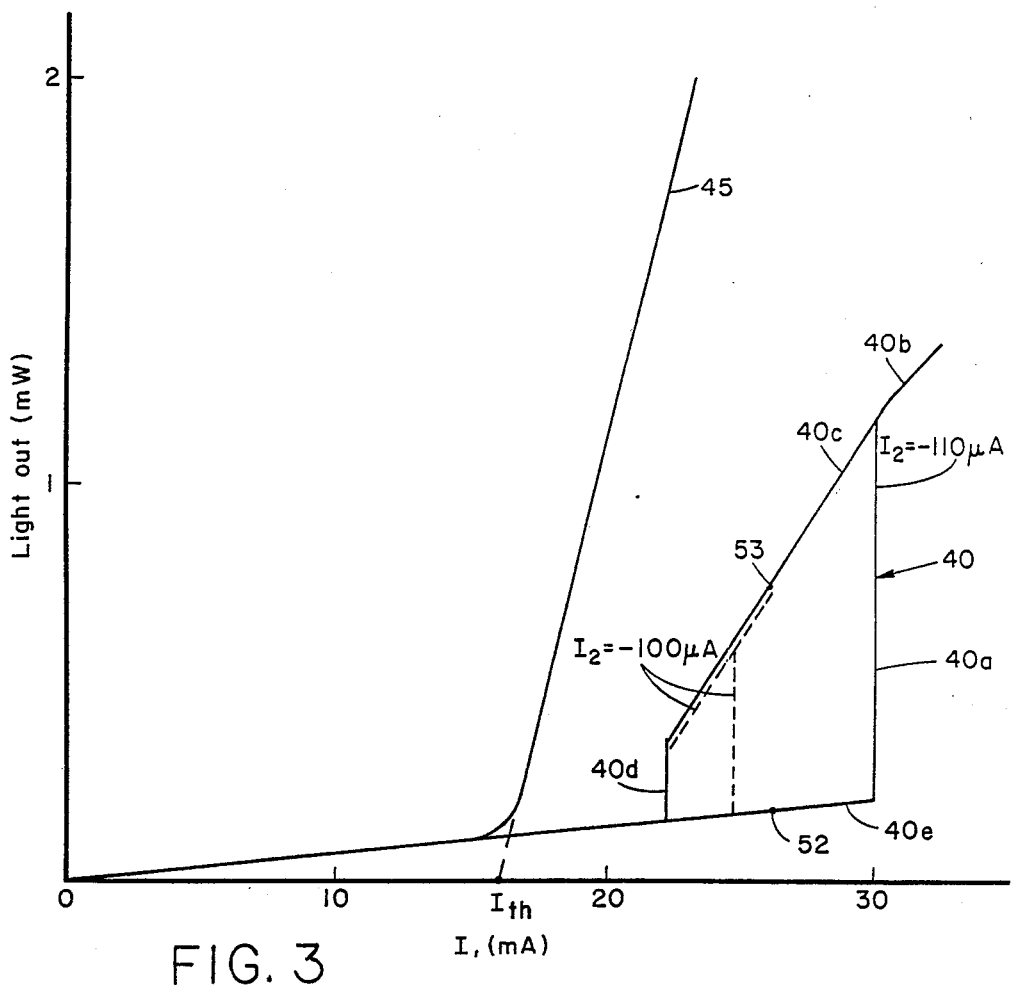
FIG. 3 is a diagram of light output vs gain current of one embodiment of the invention.

The novel laser with $R_p$ of about 10KΩ exhibited unexpected results in terms of a wide hysteresis in the light vs. gain current ($I_1$) characteristic. FIG. 3 to which reference is made is a diagram of light output vs. gain current ($I_1$), with $R_2=100K\Omega$ and representing the equivalent source impedance of the current source which supplies absorber $I_2$, and with $R_p$ on the order of 10KΩ. With $I_2=100$ μA the laser exhibits a light vs. gain current ($I_1$) hysteresis, designated by the solid line and numeral 40. For $I_2=-110$ μA the laser switches to the lasing state, i.e. relative large light output when $I_1$ equals or is greater than 30 mA, as represented by lines 40a and 40b. The light output is stable in this state and no pulsation takes place. If $I_1$ is then decreased the laser continues to lose, as represented by line 40c. The laser finally switches off at about $I_1=22$ mA as represented by line 40d. Once switched off, the laser remains off as long as $I_1$ does not exceed about 30 mA, as represented by line 40e.

It should be noted that $I_2$ is negative. That is, carriers are swept out of the absorber contact 20. In FIG. 3, a smaller hysteresis partially shown by dashed lines is diagrammed for $I_2=100$ μA. Also in FIG. 3, line 45 designates the laser output when both contacts are pumped equally. The total threshold current into both sections is designated by $I_{th}$ and is on the order of 16 mA.

It should be appreciated by those faimiliar with the art that a laser capable of exhibiting such a hysteresis with no pulsation can be used as a very effective bistable optical device. For example as shown in FIG. 2, the current $I_1$ may be supplied to the gain contact 22 from a current summer 50 to which a biasing current $I_b$ somewhere between 22 mA and 30 mA, and preferably about 26 mA is applied. With only the bias current $I_b$, $I_1 = I_b$. Thus, the laser will not be lasing. Its light output will be low on the order of 0.1 mW as represented by point 52 on line 40e in FIG. 3. In this state, the laser may be thought to be in the OFF state.

By applying a current pulse or signal to summer 50, which is designated in FIGS. 2 by $I_s$, which is sufficient to increase the summer output so that $I_1$ rises to or above 30 mA the laser is switched to the lasing state with a relatively large light output. Thereafter, even if $I_s$ is terminated, the laser light output will remain relatively high as represented by point 53 on line 40C, since the bias current $I_b$ of 26 mA will continue to be supplied by the current summer to the gain contact as $I_1$. In this lasing state, the laser may be thought of as being ON. To switch the laser back to the OFF state, all that is necessary is a current signal $I_s$ which will reduce the summer's current output $I_1$ to below 22 mA for a short duration. Upon the termination of $I_s$ the laser output will be that represented by point 52 when $I_1 = I_b = 26$ mA.

It should be pointed out that the width of the hysteresis 40 is on the order of about 8 mA, which is very wide and therefore highly useful in practical applications. Even the narrower hysteresis, when $I_2 = 100$ A, has a width on the order of more than 1 mA, which would be sufficient for using the laser as a bistable optical element in many applications.

Although the invention has been described in connection with a two-segment contact laser with a parasitic resistance on the order of 10K and a large output impedance of the electrical source driving the absorber contact, the invention is not limited thereto, as will become apparent from the following description.

Figure 3A:
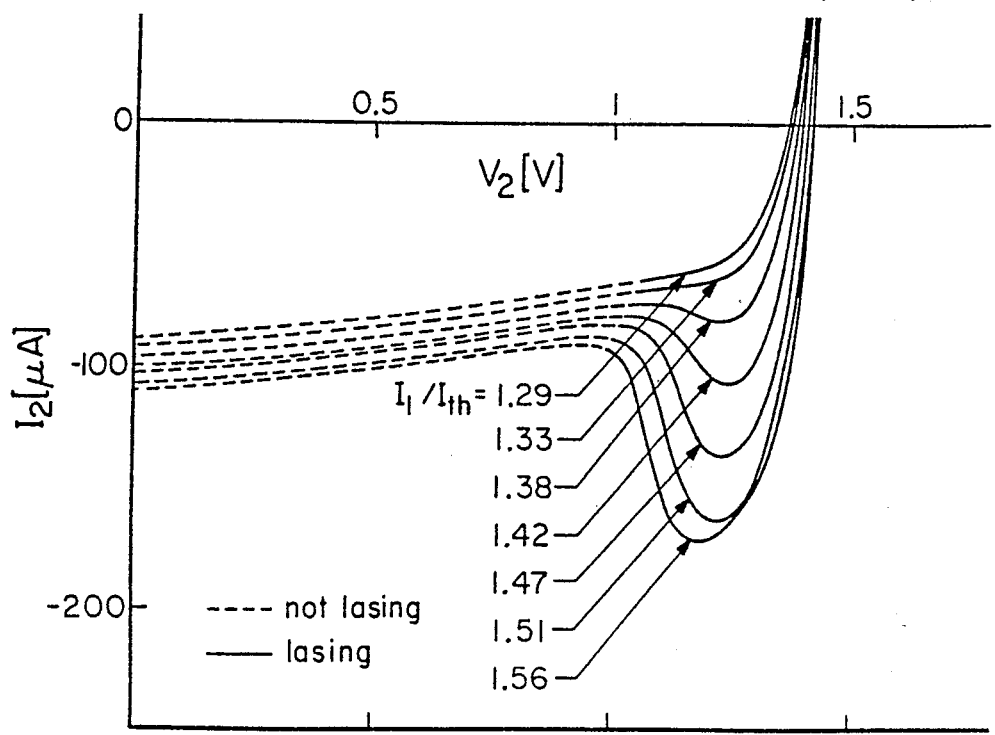
FIGS. 3a and 3b are diagrams of curves and load lines, useful in generically defining one aspect of the invention.

An important and physically revealing observation involves the variation of the current $I_2$ across the absorber section as function of $V_2$. The resulting characteristic is shown in FIG. 3a, with $I_1$ as a parameter. For $V_2 = 0$, the device does not lase and the absorbing region acts as a photodiode, collecting the spontaneous emssion from the gain section which results in a photocurrent of $I_2 = 100$ A. As $V_2$ is increased, the current ($I_2$) dependence is similar to an ordinary photodiode. The device starts to lase around $V_2 = 1.0$ V and the photo current in the absorbing section increases. With further increase of the applied voltage $V_2$, the absorber current $I_2$ is reduced and becomes positive for $V_2 \gg 1.4$ V. The group of curves in FIG. 3a has a region of negative differential resistance between $V_2 = 1.0$ V and 1.2 V, very similar to a tunnel diode.

It shall now be shown how this observed I-V characteristic of the absorbing section, when combined with those of the external bias circuit, can explain the different regimes of bistability or self-pulsation. The I-V characteristic of the absorber section is shown again in FIG. 3b together with the characterization of the source driving this section, which is given by the load line. This line shows the voltage available to the absorber section as a function of the current through it. The state of the system satisfying all circuit equations is given by the intersection of the load line with the I-V characteristic of the absorber section. $R_L$ is the effective resistance loading the absorbing section. $R_L$ can also be defined as the isolation resistance between the contacts. The bias point $P_1$ corresponds to the case when the absorbing section is biased by a source $V = -1$ V with an effective resistance of $20K\Omega$, and the gain section is pumped with $I_1/I_{th} = 1.29$. Increasing $I_1$ causes the state of the absorbing section to move along the loadline from $P_1$ to $P_5$, $P_6$ and to $P_2$ and at $I_1 I_{th} > 1.56$ to jump to $P_3$, since this is the only intersection of the load line and the absorber section characteristic. At this point, the laser is switched on, a further decrease in $I_1$ causes a jump to $P_5$ which switches the laser off.

Figure 3B:
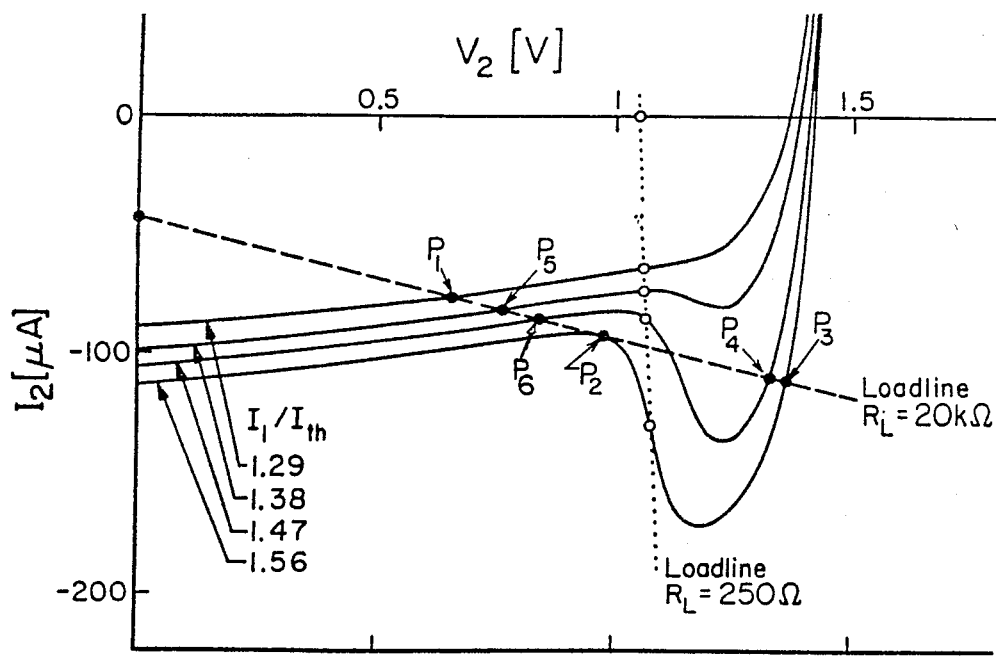

Biasing the absorbing section with a much lower impedance, for instance $R_L = 250\Omega$, forces the absorbing section to operate in a region of negative differential resistance. The resulting operating point Q is shown in FIG. 3b as the intersection of the dashed load line and the characteristic curve. This negative resistance leads to high frequency electrical oscillation and a concommitant light intensity pulsation. Since this negative resistance is not frequency selective, the pulsation takes place at the resonant frequency of a frequency selective element coupled to the negative resistance. Experiments show that the light ouput oscillates around the relaxation frequency of the diode. The importance of having a large parasitic resistance $R_p$ can now be appreciated, since the effective load resistance $R_L = R_p R_2/(R_p + R_2)$ ($R_2$ in parallel with $R_p$) is always smaller than $R_2$ or $R_p$.

Since $R_L$ is always smaller than either $R_2$ or $R_p$, it should be appreciated that both of them must be sufficiently large so that $R_L$ is sufficiently large.

To realize the advantages of the present invention, i.e. provide a bistable two-segment contact laser which can serve as a bistable optical element, $R_L$ should be large enough so that its loadline intersects the characteristic curves of the absorber current $I_2$ vs. the voltage $V_2$ at more than one point, e.g. points $P_2$ and $P_3$ in FIG. 3b. Also, to prevent oscillation, the loadline should have a positive slope so that it does not intersect the $I_2$ vs. $V_2$ characteristic curves at points representative of negative resistance.

It should further be pointed out that the foregoing teachings are not limited to a two-segmeent contact laser with a buried heterostructure. Rather, it is applicable to other types of two-segmenet contact laser.

It has been discovered that the use of the novel laser is not limited to that of a bistable optical device. The laser can also be used both as a source of light and as a detector of light which is fed back to it by reflection from a particular light reflective medium. In such an application the laser cavity acts as a detector. The medium to which light from the laser is directed and from which light is reflected or fedback to the laser may be a source of binary type information, e.g. a video disk in which the relative amount of light which is reflected back from any bit-containing spot depends on whether the bit is a one (1) or a zero (0).

Figure 4:
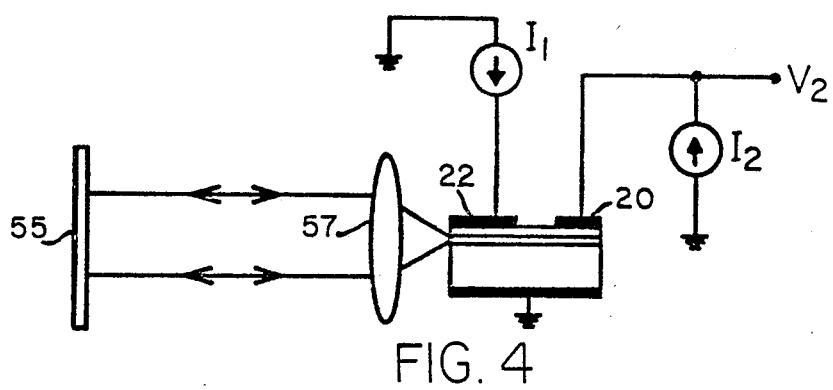
FIG. 4 is a simplified side view of the invention, useful in defining its use with light feedback.
Figure 5:
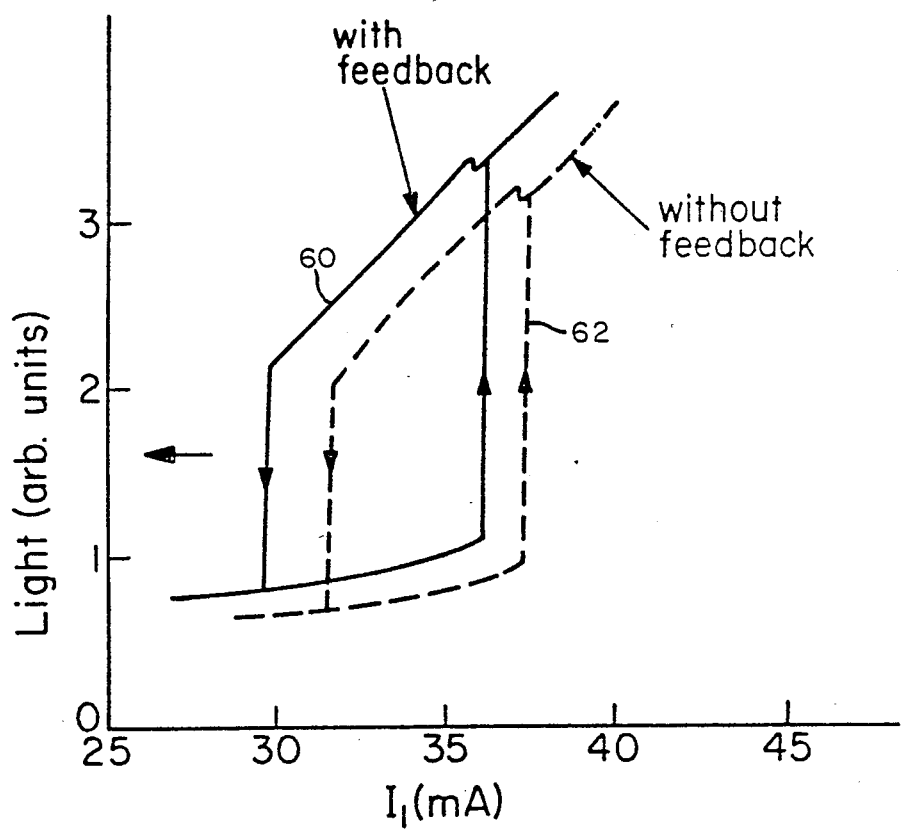
FIG. 5 is a diagram of hysteresis curves of light vs. gain current with and without light feedback.

This important aspect of the invention may best be explained in connection with the FIGS. 4–8. FIG. 4 is a simplified side view of the novel laser 10, with the light therefrom being directed to a mirror 55 through a focusing lens 57. Light from the mirror is reflected back i.e.

fed back to the laser thorugh the lens. It has been discovered that with a constant absorber current $I_2$ the laser exhibits hysteresis curves in the light vs. gain current $I_1$, such as the ones shown in FIG. 3, which are shifted with respect to one another. In FIG. 5, two hysteresis curves, one with light feedback, designated by numeral 60, and one without light feedback, designated by numeral 62, are shown. These hysteresis curves were observed where the fraction of light fed back into the laser was estimated to be around 50–60%.

To switch the bistable laser 10 ON and OFF by varying the optical feedback, it is necessary that the hysteresis curves, with and without feedback, do not overlap. Since the amount of shift of the hysteresis is relatively small, even with a fairly large feedback, one needs to decrease the size of the hysteresis. This can be done by increasing $I_2$, the pump current through the absorber section, i.e. making it less negative. FIGS. 6a, 6b and 6c are diagrams of hysteresis curves in the light (in arbitrary units) vs. $I_1$ with feedback (solid lines) and without feedback (dashed lines) for $I_2 = -85$ µA, $-75$ µA and $-65$ µA, respectively. These figures are also used to diagram the relationships between $V_2$, which is the voltage between the absorber contact and ground and $I_1$ with and without feedback.

As seen from these figures, the hysteresis curves of light vs. $I_1$ characteristic with and without light feed back do not overlap. Also the hysteresis curves tend to get narrower especially without feedback, when $I_2$ is increased i.e. is less negative. In fact, as seen from FIG. 6c there is no hysteresis curve when $I_2 = -65$ µA as indicated by dashed line 65. However, it should be noted that even though there is no hysteresis curve, by properly biasing $I_1$ a significant change in the amount of light feedback results in an appreciable change in $V_2$. For example, as shown in FIG. 6c, if $I_1$ were to be biased at 29 mA, a change in reflected light of from about 1 unit (which essentially represents no feedback) to reflected light feedback light of about 2.8 arbitrary units (representing feedback) would result in a change in $V_2$ from about 1.05 V to 1.35 V i.e. a change of several hundred mV, which is easily measurable.

This aspect of the invention may further be explained in connection with FIG. 7 wherein curves the laser light output and $V_2$ vs. relative amount of light feedback relationships are diagrammed for laser 10 biased with $I_1 = 29.5$ mA and $I_2 = -78$ µA.

It should be appreciated from FIG. 7 that as long as the relative amount of light feedback is not greater than about 0.25 the voltage $V_2$ will always be low, e.g. 1.02 V. Only when the relative amount of feedback equals or exceeds a value of about 0.75 does the voltage increase sharply to about 1.38 V.

The significant change in $V_2$, which is easily measurable across the absorber contact, is highly advantageous for using the laser as a non-contact or floating optical stylus to read out binary information which is stored in an appropriate medium as reflective spots. In such a medium, e.g. a video disk, spots storing 1's have one reflective property, e.g. high reflection, and 0's have another reflective property, e.g. low or no reflection. Thus, if such a disk were to be placed in the feedback path, high light feedback would result when reading out 1's, which will be indicated by a high values of $V_2$. On the other hand, when reading out 0's since they do not reflect light, the relative amount of light feedback would be very low if any, and therefore $V_2$ would be low.

It should be stressed that for the foregoing assumptions, i.e. that 1's are reflective spots and 0's are non-reflective, ideally no light should be fed back to the laser 10 when a 0 is read out. Under practical situations however this is not always the case. Sometimes, some light is reflected back from dust particles or the like, representing optical noise. Such optical noise, however would not affect the reliable performance of the novel invention since, as shown in FIG. 7, the laser 10 can be biased so that even if a relatively large amount of relative light is fed back, e.g. 0.25, the laser will provide a low $V_2$ output to represent a 0. When the laser is OFF, such as after having readout a 0, as long as the relative amount of feedback is less than 0.75, $V_2$ remains low, to represent a 0. Only when a binary 1 is in the feedback path so that the relative amount of light feedback exceeds 0.75, does $V_2$ rise to a high level, thereby designating the readout of a 1.

It should be pointed out that in the prior art, in lasers other than of the two-segment contact, extremely small changes in the contact voltage, on the order of 1 mV were observed as a function of relative amounts of light feedback. Such lasers could not be used as practical devices for optical information readout. As seen from FIG. 7, with the present invention voltage changes on the order of hundreds of millivolts are attainable, thereby accounting for the practical and usefulness of the invention as an optical readout device.

It should also be pointed out that for such purposes, the laser need not be biased so as to produce a wide hysteresis of absorber voltage $V_2$ vs. relative amounts of light feedback. One may obtain less than optimum results by biasing the laser to exhibit strong nonlinear behavior in $V_2$ vs. relative amount of light feedback which instead of a wide hysteresis could be represented by an essentially S shaped line 75 as shown in FIG. 7a. Such strong nonlinearity behavior is realizable due to the fact that in the two-segmenet contact laser one can selectively choose the biasing currents for the contacts and further can control $R_1$ by controlling $R_2$ and/or $R_p$.

FIG. 8, to which reference is now made, shows an arrangement in which laser 10 is used as a non-contact or floating optical stylus for information readout. In FIG. 8, elements like those previously described are designated by like numerals. As seen from FIG. 8, the light from laser 10, is directed to an optical disk, containing binary information e.g. a videodisk 80 from lens 57 through a reflective mirror 82. Any light reflected by information spots on disk 80 are reflected to mirror 82, focused by lens 57 and fedback to the laser.

From the foregoing, it should be appreciated that when a light reflective bit e.g. a 1 is in the light path the fedback light is high and therefore $V_2$ is high, as designated by numerals 84, on an arbitrarily diagrammed $V_2$, output waveform 85. On the other hand, when a bit which does not reflect light, e.g. a 0, is in the light path the relative amount of light fedback is very low, if any, and therefor $V_2$, is low as represented by numerals 86 on the waveform 85. It has been discovered when reducing the invention to practice, that improved performance is attainable by coating the end of the laser through which the light is transmitted and received as feed back with a layer of anti-reflective matter. Such a layer is designated in FIG. 8 by numeral 90.

It should be further appreciated that the laser 10 is a highly efficient non-contact or floating stylus for reading out information from any type of optical disk. Also, it should be appreciated that the laser 10 in addition to serving as the source of light which exits its waveguide cavity 12, also serves as a detector. The laser can be thought of one having an intra-cavity detector, since the relative amount of light fed back to the laser cavity is easily measurable by measuring the voltage $V_2$ across the absorber contact.

Although particular embodiments of the invention have been described and illustrated herein, it is recognized that modifications and variations may readily occur to those skilled in the art and consequently, it is intended that the claims be interpreted to cover such modifications and equivalents.

What is claimed is:

1. A bistable optical element comprising:
   a two-segment contact laser having first and second contacts definable as the gain contact and the absorber contact, said laser being characterized by a parasitic resistance significantly greater than 1 kilohm between said contacts, definable as $R_p$, said parasitic resistance being sufficient to produce very good electrical separation between contacts so that the absorber contact appears to be driven by nearly a pure current source, means for biasing said absorber contact for a current $I_2$ with a voltage $V_2$, said biasing means having an output impedance $R_2$, and means for biasing said gain contact with current $I_1$, the $I_2$ and $V_2$ relationship being representable by curves for various values of the gain contact current $I_1$ over the laser threshold current, definable as $I_{th}$, and said parasitic resistance $R_p$ of said laser and said output impedance provides an effective load resistance $R_L$, where $R_L = R_p R_2/(R_p + R_2)$, whereby $R_L$ is large enough so that its loadline intersects the characteristic curves of the absorber current $I_2$ versus the voltage $V_2$ at more than one point.

2. A bistable optical element as recited in claim 1 wherein said loadline intersects each of said $I_2$-$V_2$ characteristic curves at a region of positive slope for stability.

3. A bistable optical element as recited in claim 1 wherein $R_2$ is on the order of ten or more kilohms.

4. A bistable optical element as recited in claim 1 wherein $R_p$ is substantially on the order of not less than 5 kilohms.

5. A bistable optical element as recited in claim 4 wherein said loadline intersects each of said $I_2$-$V_2$ characteristic curves at a region of positive slope.

6. A bistable optical element as recited in claim 5 wherein said laser is of the buried heterostructure type.

7. A bistable optical element comprising:
   a two-segment contact laser, having a gain contact and a spaced-apart absorber contact, said laser being characterized by a high resistance between said contacts significantly greater than 1 kilohm, definable as $R_p$, said parasitic resistance being sufficient to produce very good electrical separation between contacts so that the absorber contact appears to be driven by nearly a pure current source,
   means for biasing said gain contact for a current $I_1$ therethrough; and
   means for biasing said absorber contact for a current $I_2$, whereby said laser exhibits a hysteresis curve in the light output versus the gain contact current $I_1$ characteristic so that the laser light output is in a first level range, definable as a low level when $I_1$ is below a first selected value, and the light output is in a second level range when $I_1$ is above a second selected value, said laser's hysteresis curve being further characterized by a light output in a third level range which is between said first and said second level ranges when $I_1$, after exceeding said second value, drops to a value below said second value and above said first selected value.

8. A bistable optical element as recited in claim 7 wherein the difference between said first and second values of said $I_1$ is on the order of not less than 1 milliamperes.

9. A bistable optical element as recited in claim 8 further including means for applying a bias current, definable as $I_b$ to said gain contact, $I_1$ being equal to $I_b$ in the absence of a current pulse, definable as $I_s$, and $I_b$ being between said first and second values of $I_1$; and
   means for selectively applying $I_s$ of first polarity so as to increase $I_2$ to above said second value, whereby upon the termination of a current pulse $I_s$ of said first polarity, $I_1$ equals $I_b$ and the laser light output is of a level in said third level range, and upon applying a current pulse $I_s$ of a second polarity such that $I_s + I_b = I_1$ of a level below said first value, the laser light output drops to said first level range, and upon the termination of the current pulse $I_s$, the light output level is below said third light level range.

10. An optical element as recited in claim 9 wherein said laser is of the buried heterostructure type.

11. An optical element as recited in claim 10 wherein $R_p$ is on the order of not less than 5 kilohms.

12. An arrangement for reading out binary information which is stored as reflective and substantially nonreflective spots on a medium, the arrangement comprising:
   a laser able to operate in a biasable mode with preselected electrical parameters, for providing a beam of light; said laser comprising
      a two-segment contact laser having first and second contacts definable as the gain contact and the absorber contact, said laser being characterized by a parasitic resistance $R_p$ significantly greater than 1 kilohm between said contacts sufficient to produce very good electrical separation between contacts so that the absorber contact appears to be driven by nearly a pure current source, means for biasing said absorber contact for a current $I_2$ with a voltage $V_2$ having an output impedance $R_2$, and means for biasing said gain contact for a current $I_1$, the $I_2$ and $V_2$ relationship being representable by curves for various values of the gain contact current $I_1$ over the laser threshold current, definable as $I_{th}$, and said parasitic resistance $R_p$ of said laser, and said output impedance provides an effective load resistance $R_L$ where $R_L = R_p R_2/(R_p + R_2)$, whereby $R_L$ is large enough so that its loadline intersects the characteristic curves of the absorber current $I_2$ versus the voltage $V_2$ at more than one point,
   light feedback means to which said beam of light is directed for reflecting light back to said laser, said light feedback means including said medium whereby light is fed back therefrom to said laser from reflective or substantially nonreflective spots, thereby varying the relative amount of light fed back to said laser, and
   means for biasing said laser for a predetermined response when the relative amount of light which is fed back is low, said predetermined response being characterized by the level of an easily measurable parameter across said laser being low and when the relative amount of light fed back is high, the level of said measurable parameter is high.

13. An arrangement as recited in claim 12 wherein the measurable parameter is the voltage across the absorber contact defined as $V_2$.

14. An arrangement as recited in claim 13 wherein the difference between the low and high levels of $V_2$ is n where n is on the order of not less than tens of millivolts.

15. An arrangement as recited in claim 14 wherein n is on the order of not less than 100 millivolts.

16. An arrangement as recited in claim 13 wherein said laser is biasable with selected gain contact and absorber contact currents, definable as $I_1$ and $I_2$ respectively, whereby said laser exhibits a hysteresis curve in the $V_2$ versus relative amount of light feedback characteristic, so that as long as the relative amount of light fed back to said laser is below a first value, $V_2$ is substantially low, and remains low until said relative amount of light fed back to said laser does not equal a second value, with $V_2$ increasing to said high level once the relative amount of light fed back to said laser is not less than said second value, and $V_2$ remaining at substantially said high level as long as the relative amount of light fed back to said laser is substantially greater than said first value.

17. An arrangement as recited in claim 16 wherein the difference between the low and high levels of $V_2$ is n where n is on the order of not less than tens of millivolts.

18. An arrangement as recited in claim 17 wherein the laser is of the buried heterostructure type.

19. An arrangement as recited in claim 16 wherein said medium is a video disk.

20. An arrangement as recited in claim 12 wherein said medium is a video disk.

21. An arrangement as recited in claim 20 wherein the measurable parameter is the voltage across the absorber contact defined as $V_2$.

22. An arrangement as recited in claim 21 wherein the difference between the low and high levels of $V_2$ is n, where n is on the order of not less than tens of millivolts.

23. An arrangement as recited in claim 22 wherein n is on the order of not less than 100.

24. An arrangement as recited in claim 20 wherein said laser is biasable with selected gain contact and absorber contact currents, definable as $I_1$ and $I_2$ respectively, whereby said laser exhibits a hysteresis curve in the $V_2$ versus relative amount of light feedback characteristic, so that as long as the relative amount of light fed back to said laser is below a first value, $V_2$ is substantially low, and remains low until said relative amount of light fed back to said laser does not equal a second value, with $V_2$ increasing to said high level once the relative amouht of light fed back to said laser is not less than said second value, and $V_2$ remaining at substantially said high level as long as the relative amount of light fed back to said laser is substantially greater than said first value.

25. An arrangement as recited in claim 24 wherein the difference between the low and high levels of $V_2$ is n, where n is on the order of not less than tens of millivolts.

26. An arrangement as recited in claim 25 wherein the laser is of the buried heterostructure type.

27. An arrangement as recited in claim 26 wherein n is on the order of not less than 100.

* * * * *

UNITED STATES PATENT AND TRADEMARK OFFICE
CERTIFICATE OF CORRECTION

PATENT NO. : 4,562,569
DATED : December 31, 1985
INVENTOR(S) : Yariv, et al.

It is certified that error appears in the above-identified patent and that said Letters Patent are hereby corrected as shown below:

```
In the Abstract, line 14, "serve" should be -- serves --
Col. 2, line 30, "fedback" should be -- fed back --
Col. 2, line 55, "of" after "of control" should be -- or --
Col. 3, line 56, "respetively" should be -- respectively --
Col. 4, line 50 "100" should be -- 400 --
Col. 4, line 53, "100" should be --  -110 --
Col. 4, line 68, "100" should be --  -100 --
Col. 5, line 36, "100" should be --  -100 --
Col. 5, line 52, "emssion" should be -- emission --
Col. 5, line 58, "V₂>>1.4V" should be -- $V_2 > 1.4V$ --
Col. 6, line 59, "fedback" should be -- fed back --
Col. 7, line 1, "thorugh" should be -- through --
Col. 8, line 13, "readout" should be -- read out --
Col. 8, line 38, "two-segmenet should be -- two-segment --
Col. 8, line 50, "fedback" should be -- fed back --
Col. 8, line 53, "fedback" should be -- fed back --
Col. 8, line 57, "fedback" should be -- fed back --
Col. 8, line 58, "therefor" should be -- therefore --
```

UNITED STATES PATENT AND TRADEMARK OFFICE
CERTIFICATE OF CORRECTION

PATENT NO. : 4,562,569

DATED : December 31, 1985

INVENTOR(S) : Yariv, et al.

It is certified that error appears in the above-identified patent and that said Letters Patent is hereby corrected as shown below:

Claim 23, line 2, after "100" insert -- millivolts --
Claim 27, line 2, after "100" insert -- millivolts --

Signed and Sealed this

First Day of July 1986

[SEAL]

Attest:

DONALD J. QUIGG

Attesting Officer

Commissioner of Patents and Trademarks